United States Patent
Obeidat et al.

(10) Patent No.: US 7,406,101 B1
(45) Date of Patent: Jul. 29, 2008

(54) SYSTEM AND METHOD FOR PROVIDING ON-CHIP DELAY MEASUREMENTS IN SERIALIZER / DESERIALIZER SYSTEMS

(75) Inventors: Amjad T. Obeidat, Santa Clara, CA (US); Henry Yao, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 767 days.

(21) Appl. No.: 11/010,091

(22) Filed: Dec. 10, 2004

(51) Int. Cl.
*H04J 3/06* (2006.01)
*H04L 25/00* (2006.01)
*G06F 13/12* (2006.01)

(52) U.S. Cl. .................. 370/503; 370/252; 370/389; 370/371; 370/376; 710/65

(58) Field of Classification Search ........... 370/252, 370/235, 389, 392, 412, 427, 522, 465; 375/371, 375/354–356, 376; 710/62, 65, 71
See application file for complete search history.

(56) References Cited

U.S. PATENT DOCUMENTS

| | | | | |
|---|---|---|---|---|
| 6,343,081 | B1 * | 1/2002 | Blanc et al. | 370/411 |
| 2004/0017806 | A1 * | 1/2004 | Yazdy et al. | 370/389 |

* cited by examiner

*Primary Examiner*—Afsar M. Qureshi

(57) ABSTRACT

A system and method is provided for making highly accurate data propagation delay measurements in a serializer/deserializer (SERDES) integrated circuit. The invention detects a selected special character when the special character is present at the input of a transmit data path of the SERDES integrated circuit. The invention also detects the special character when the special character appears at the output of the transmit data path. The invention then counts the number of clock cycles during which the selected character was in the transmit data path. This provides the data propagation delay of the special character through the transmit data path. The invention also makes data propagation delay measurements for a receive data path of a SERDES integrated circuit.

31 Claims, 12 Drawing Sheets

SYSTEM AND METHOD FOR PROVIDING ON-CHIP DELAY MEASUREMENTS IN SERIALIZER / DESERIALIZER SYSTEMS

TECHNICAL FIELD OF THE INVENTION

The present invention is generally directed to the manufacture of semiconductor devices and, in particular, to a system and method for making highly accurate data propagation delay measurements in a serializer/deserializer system.

BACKGROUND OF THE INVENTION

Serializer/deserializer (SERDES) integrated circuits are commonly used in electronic systems where there is a need for transporting large amounts of data at high speed between two slow speed systems. SERDES integrated circuits have a wide range of applications from personal computer (PC) motherboards to cellular mobile base stations. Such applications sometimes demand precise knowledge of the propagation delay that results from transporting the data between two modules.

A SERDES integrated circuit (or "SERDES chip") can transport large amounts of data at high speed within an electronic system. A SERDES chip is typically used to transport data across a board or a backplane. A SERDES chip usually has two input/output (I/O) interfaces. One of the I/O interfaces is a low speed, parallel bus interface that sends and receives data bits from other components (e.g., application specific integrated circuits (ASICS) or microprocessors). The other I/O interface operates at high speed and sends and receives data through a serial line that usually comprises a pair of wires or signal traces on a board.

FIG. 1 illustrates a schematic diagram of a prior art SERDES chip 100. The transmitter (TX) 105 of SERDES chip 100 shown in FIG. 1 receives data from a low speed N-bit parallel input bus 110. The SERDES chip 100 converts the low speed parallel N-bits into a serial data stream. The transmitter 105 of the SERDES chip 100 then transmits the serial data stream on a high-speed serial output bus 115.

The receiver (RX) 120 of SERDES chip 100 also receives data from a high-speed serial input bus 125. The SERDES chip 100 converts the high-speed serial data into a N-bit parallel data stream. The receiver 120 of the SERDES chip 100 then outputs the parallel data stream on a low speed N-bit parallel output bus 130.

FIG. 2 illustrates how two prior art SERDES chips (220 and 230) may employed in a cellular mobile base station 200. The control system 210 of the base station 200 processes the data and sends the data through a low speed parallel bus 215 to the parallel input of SERDES chip 220. The SERDES chip 220 serializes the data and then transmits the data at high speed through transmission medium 225 to the remote SERDES chip 230. The remote SERDES chip 230 deserializes the data and sends the deserialized data to the remote system 240 on a low speed N-bit parallel output bus 235. The remote system 240 then sends the data to radio tower 245.

Similarly, the remote system 240 of the base station 200 processes data and sends the data through a low speed parallel input bus 250 to the parallel input of remote SERDES chip 230. The remote SERDES chip 230 serializes the data and then transmits the serialized data at high speed through transmission medium 255 to the SERDES chip 220. The SERDES chip 220 deserializes the data and sends the deserialized data to the control system 210 on a low speed N-bit parallel output bus 260.

The transmission medium (225 and 255) between SERDES chip 220 and SERDES chip 230 could be an electrical link in the form of a pair of signal traces on a board or a cable going from board to board. The transmission medium (225 and 255) could also be an optical link in a case in which the SERDES signals go to the input of an optical transceiver that converts the electrical signals to optical signals for transmission to the remote system.

In a SERDES system of the type shown in FIG. 2 the system operator is often interested in acquiring a precise measurement of the data propagation delay between the control system 210 and the remote system 240. To obtain this information it is necessary to know the data propagation delay in the SERDES chips (220 and 230). In a SERDES chip there are a number of propagation delays that are of interest to a system operator. Consider, for example, the data propagation delays in the SERDES chip 220 illustrated in FIG. 3.

The data propagation delay that is denoted $T_{PS}$ refers to the delay from the parallel input bus 215 to the serial output transmission medium 225. The data propagation delay that is denoted $T_{SS}$ refers to the delay from the serial output transmission medium 225 to the serial input transmission medium 255. The data propagation delay that is denoted $T_{SP}$ refers to the delay from the serial input transmission medium 255 to the parallel output bus 260. The data propagation delay that is denoted $T_{PP}$ refers to the delay from the parallel input bus 215 to the parallel output bus 260.

The measurements ($T_{PS}$, $T_{SS}$, $T_{SP}$, $T_{PP}$) allow the control system 210 to measure the data propagation delay not only across the SERDES chip 220 but also across other components in the system. This is accomplished by taking advantage of several loop-back capabilities that are available within SERDES chips and within the system in general. A SERDES chip is capable of looping back data along the $T_{PP}$ path, the $T_{SS}$ path, the $T_{PS}$-$T_{SS}$-$T_{SP}$ path, and the $T_{SP}$-$T_{PP}$-$T_{PS}$ path. The $T_{SP}$-$T_{PP}$-$T_{PS}$ path is not shown in FIG. 3. By utilizing the loop-back modes and the data propagation delay measurements, control system 210 can estimate such things as data propagation delay across the transmission medium (225 and 255) between SERDES chip 220 and SERDES chip 230, the data propagation delay through SERDES chip 220, the data propagation delay through SERDES chip 230, and the data propagation delay through the remote system 240.

FIG. 4 illustrates an exemplary transmit data path within a prior art SERDES chip. A signal conditioning unit 410 of the transmitter portion of the SERDES chip receives data from a low speed N-bit parallel input bus. The data is then passed to a synchronizer (first in first out (FIFO)) unit 420. The synchronized data is then encoded in encoder 430 and passed to synchronizer (first in first out (FIFO)) unit 440. The parallel data is then serialized in serializer unit 450. The serial data is then transmitted by high-speed transmitter 460.

As shown in FIG. 4, the synchronizer (FIFO) unit 420 bridges input low speed clock domain 470 and internal low speed clock domain 480. The synchronizer (FIFO) unit 440 bridges internal low speed clock domain 480 and low speed serializer clock domain 490. Serializer unit 450 bridges low speed serializer clock domain 490 and high-speed transmitter clock domain 495.

FIG. 5 illustrates an exemplary receive data path within a prior art SERDES integrated circuit chip. An equalizer unit 510 of the receiver portion of the SERDES chip receives data from a high-speed serial input bus. The data is then passed to a clock and data recovery unit 520. The serial data is then deserialized in deserializer unit 530. The data is then decoded in decoder unit 540. The data is then passed to synchronizer (first in first out (FIFO)) unit 550. The synchronized data is then passed to signal conditioning unit 560. The data is then output from signal conditioning unit 560 to a low speed N-bit parallel output bus.

As shown in FIG. 5, the deserializer unit 530 bridges high-speed receiver clock domain 570 and internal low speed clock domain 580. The synchronizer (first in first out (FIFO)) unit 550 bridges internal low speed clock domain 580 and output low speed clock domain 590.

FIG. 4 shows that there are multiple clock domains (470, 480, 490, 495) along the transmit data path. FIG. 5 shows that there are multiple clock domains (570, 580, 590) along the receive data path. These multiple clock domains have different frequencies and have arbitrary phase relationships with respect to each other. The presence of multiple clock domains complicates the process of accurately measuring the data propagation delay in a SERDES chip.

In addition, the synchronizer (FIFO) units have delays that may vary depending upon operating conditions. That is, there are certain delays in a SERDES chip that can vary over time. It is also rather difficult to measure the precise data propagation delay of data packets that are being converted from the parallel domain to the serial domain (or from the serial domain to the parallel domain). These factors complicate the measurement of data propagation delay in a SERDES chip.

Some attempts have been made in the prior art to quantify the data propagation delay across a SERDES chip. The major difficulty lies in measuring the data propagation delay between the parallel side and the serial side of the SERDES chip.

This difficulty stems from (1) the large difference in the two data rates (low speed versus high speed), and (2) the difference in data format (serial versus parallel) at the two ends, and (3) the multiple clock domains through which the data passes. For these reasons prior art measurement attempts have generally focused on measuring the data propagation delay for elements that do not convert the data format from parallel to serial (or from serial to parallel).

One prior art approach has been to measure the data propagation delay across the synchronizer (FIFO) units. The synchronizer (FIFO) units synchronize data transfer between the different clock domains in a SERDES chip. The first in first out (FIFO) data propagation delay depends on the phase and frequency difference between the two clock domains that are straddled by a synchronizer (FIFO) unit. This makes the data propagation delay across a synchronizer (FIFO) unit inherently ambiguous.

The data propagation delay across the synchronizer (FIFO) units can account for a significant part of the total data propagation delay within a SERDES chip. The prior art method that is used to measure the data propagation delay across the synchronizer (FIFO) units uses a counter that detects the time that it takes certain characters in the bit stream to travel from the input to the output. This approach suffers from the inherent disadvantage of not being able to account for the total data propagation delay across the SERDES chip. Because the data propagation delay across the synchronizer (FIFO) units does not account for the total data propagation delay within the SERDES chip, the measurement of the data propagation delay across the synchronizer (FIFO) units is at best only an approximation of the total data propagation delay within the SERDES chip.

In order to overcome the limitations that are involved in measuring only the data propagation delay across the synchronizer (FIFO) units, other prior art methods have used external application specific integrated circuits (ASICs) to measure the data propagation delay across a SERDES chip. The ASIC chips typically run at a fraction of the speed of a SERDES chip. This means that an ASIC chip has to rely on measuring the round trip time through a SERDES chip with both the input and the output being accessed from the parallel side.

This method has two limitations. The first limitation is that the data propagation delay may not be symmetrical along the parallel-to-serial path and the serial-to-parallel path in a SERDES chip. That is, the delay along the parallel-to-serial path may not be equal to the delay along the serial-to-parallel path. An ASIC chip will not be able to decouple the delay across one of the paths from the delay across the other of the two paths.

The second limitation is that the ASIC chip has a slow clock speed. The accuracy of the delay measurement is primarily determined by the clock speed of the measuring device. This means that the ASIC chip method is limited to low accuracy. The ASIC chip method may therefore be unsuitable for certain applications such as applications in the cellular base station market.

Therefore, there is a need in the art for an improved system and method for making highly accurate data propagation delay measurements in a SERDES integrated circuit.

SUMMARY OF THE INVENTION

To address the above-discussed deficiencies of the prior art, it is a primary object of the present invention to provide a system and method for making highly accurate data propagation delay measurements in a SERDES integrated circuit.

In one advantageous embodiment the present invention provides circuitry that is capable of detecting a selected special character when the special character is present at the input of a transmit data path of the SERDES integrated circuit. The invention also provides circuitry that is capable of detecting the special character when the special character appears at the output of the transmit data path. The circuitry of the invention counts the number of clock cycles that occurred during the time that the special character was in transit through the transmit data path. This provides the data propagation delay of the special character through the transmit data path.

The invention comprises a start/stop counter that starts counting clock cycles when the special character is detected at the input of the transmit data path. The start/stop counter stops counting clock cycles when the special character is detected at the output of the transmit data path. The data propagation delay through the transmit data path is then calculated from the measured number of clock cycles.

In another advantageous embodiment the present invention accurately measures data propagation delay for a receive data path of a SERDES integrated circuit.

It is an object of the present invention to provide a system and method for making highly accurate data propagation delay measurements in a SERDES integrated circuit.

It is also an object of the present invention to provide a system and method for making highly accurate data propagation delay measurements in a transmit data path of a SERDES integrated circuit.

It is yet another object of the present invention to provide a system and method for making highly accurate data propagation delay measurements in a receive data path of a SERDES integrated circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
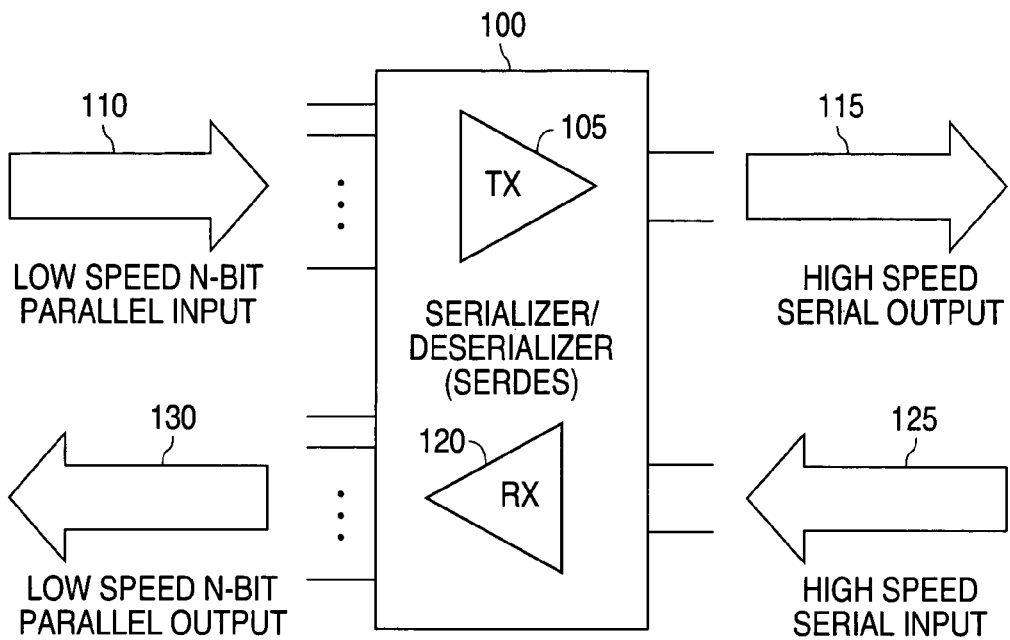
FIG. 1 illustrates a schematic diagram of a prior art SERDES integrated circuit chip.

FIGS. 1 through 14 and the various embodiments used to describe the principles of the present invention in this patent document are by way of illustration only and should not be construed in any way to limit the scope of the invention. Those skilled in the art will understand that the principles of the present invention may be implemented in any type of suitably arranged serializer/deserializer (SERDES) circuit.

To simplify the drawings the reference numerals from previous drawings will sometimes not be repeated for structures that have already been identified.

Figure 6:
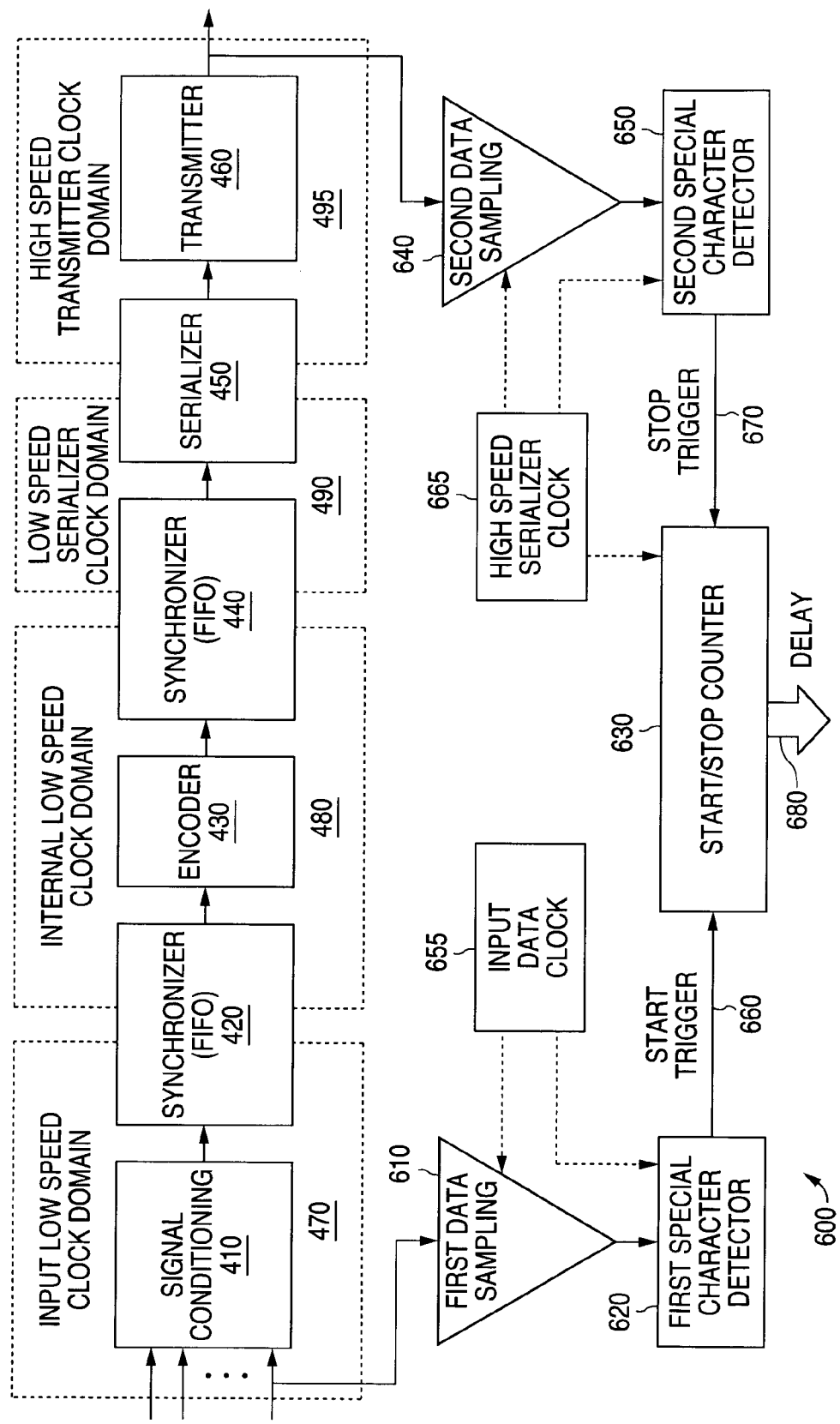
FIG. 6 illustrates a schematic diagram of an advantageous embodiment of a data propagation delay measurement circuit of the present invention for measuring on-chip data propagation delay in a transmit data path of a SERDES integrated circuit chip.

FIG. 6 illustrates a schematic diagram of an advantageous embodiment of data propagation delay measurement circuit 600 of the present invention for measuring on-chip data propagation delay in a transmit data path of a SERDES integrated circuit chip. As shown in FIG. 6, the transmit data path comprises the prior art transmit data path of FIG. 4. The data propagation delay measurement circuit 600 of the present invention comprises a first data sampling circuit 610 that samples data from the parallel input bus of the transmit data path, a first special character detector 620, a start/stop counter 630, a second data sampling circuit 640 that samples data from the serial output bus of the transmit data path, and a second special character detector 650.

The data propagation delay measurement that is obtained by data propagation delay measurement circuit 600 relies on the detection of special characters (or data packets) that are embedded in the data stream. Special characters in the transmit data path are embedded by the control system (e.g., control system 210 of FIG. 2). Special characters in the receive data path (to be discussed later) are embedded by the remote system (e.g., remote system 240 of FIG. 2).

The special characters depend on the type of line coding that is used in the SERDES system. For example, if 8B/10B encoding is used in the SERDES system, then the K28.5 pattern (also known as the "comma" character) occurs periodically. Assume that the K28.5 pattern is selected to serve as the "special" character to be detected. Then the data propagation delay measurement circuit 600 (1) searches for and detects a K28.5 character at the input of the transmit data path, (2) searches for and detects the emergence of the K28.5 character from the transmit data path, and (3) obtains the elapsed time that the K28.5 character has spent within the transmit data path.

FIG. 6 illustrates the structure and operation of an advantageous embodiment of the data propagation delay measurement circuit 600 of the present invention. When data propagation measurement circuit 600 is enabled, the first data sampling circuit 610 samples data from the parallel input bus of the transmit data path. The input data samples are loaded into first special character detector 620. The first data sampling circuit 610 and the first special character detector 620 receive clock signals from input data clock 655.

For the purpose of providing a specific example, assume that the special character to be detected is selected to be the K28.5 ("comma") character in the case of 8B/10B encoding. It is understood that the present invention is not limited to the use of this particular character. Any character may be selected to be the special character to be detected by data propagation delay measurement circuit 600.

When first special character detector 620 detects the special character, then first special character detector 620 generates a start trigger signal 660 and sends the start trigger signal 660 to start/stop counter 630. Start/stop counter 630 also receives clock signals from high-speed serializer clock 665. When start/stop counter 630 receives a start trigger signal 660, then start/stop counter 630 begins to count every clock pulse of the high-speed serializer clock 665.

At the other end of the transmit data path (i.e., after transmitter 460) the second data sampling circuit 640 samples data from the serial output bus. The output data samples are loaded into second special character detector 650. The second data sampling circuit 640 and the second special character detector 650 receive clock signals from high-speed serializer clock 665.

When second special character detector 650 detects the special character after the special character has emerged from transmitter 460 at the end of the transmit data path, then second special character detector 650 generates a stop trigger signal 670 and sends the stop trigger signal 670 to start/stop counter 630. When start/stop counter 630 receives the stop trigger signal 670, then start/stop counter 630 stops counting the clock pulses of the high-speed serializer clock 665.

That is to say, start/stop counter 630 freezes the count of clock pulses. The count of high-speed serializer clock pulses represents the data propagation delay 680 of the special character through the transmit data path. Start/stop counter 630 passes the value of the data propagation delay 680 on to on-chip digital circuitry (not shown in FIG. 6). The on-chip digital circuitry can easily convert the number of clock pulses to the actual elapsed time and pass the actual elapsed time on to an external system (not shown in FIG. 6).

In this manner the data propagation delay measurement circuit 600 of the present invention accurately measures the data propagation delay for characters that are sent through the SERDES transmit data path (410 through 460). In order to measure the delay with high accuracy and minimal uncertainty, the data propagation delay of signals that go through the input side of data propagation delay measurement circuit 600 (i.e., through the first data sampling circuit 610 and the first special character detector 620) must be equal to the data propagation delay of signals that go through the output side of data propagation delay measurement circuit 600 (i.e., through the second data sampling circuit 640 and the second special character detector 650).

The delay through the input side of data propagation delay measurement circuit 600 ("input side delay") and the delay through the output side of data propagation delay measurement circuit 600 ("output side delay") must be well-matched. The input side delay and the output side delay are matched by using identical circuitry for both the input side (coupled to the parallel input bus of the transmit data path) and the output side (coupled to the serial output bus of the transmit data path). The input side delay and the output side delay are also matched by matching the propagation delays of the start trigger signals and the stop trigger signals to the start/stop counter 630. This ensures maximum accuracy in obtaining the data propagation delay for characters that are sent through the SERDES transmit data path (410 through 460).

One of the key features of the present invention is the use of substantially similar techniques and circuitry to detect the special character at both the parallel input end of the transmit data path and the serial output end of the transmit data path. The detection of the special character is not a trivial task in view of the differences in the data speed and the differences in data representation at the two ends of the transmit data path.

Figure 7:
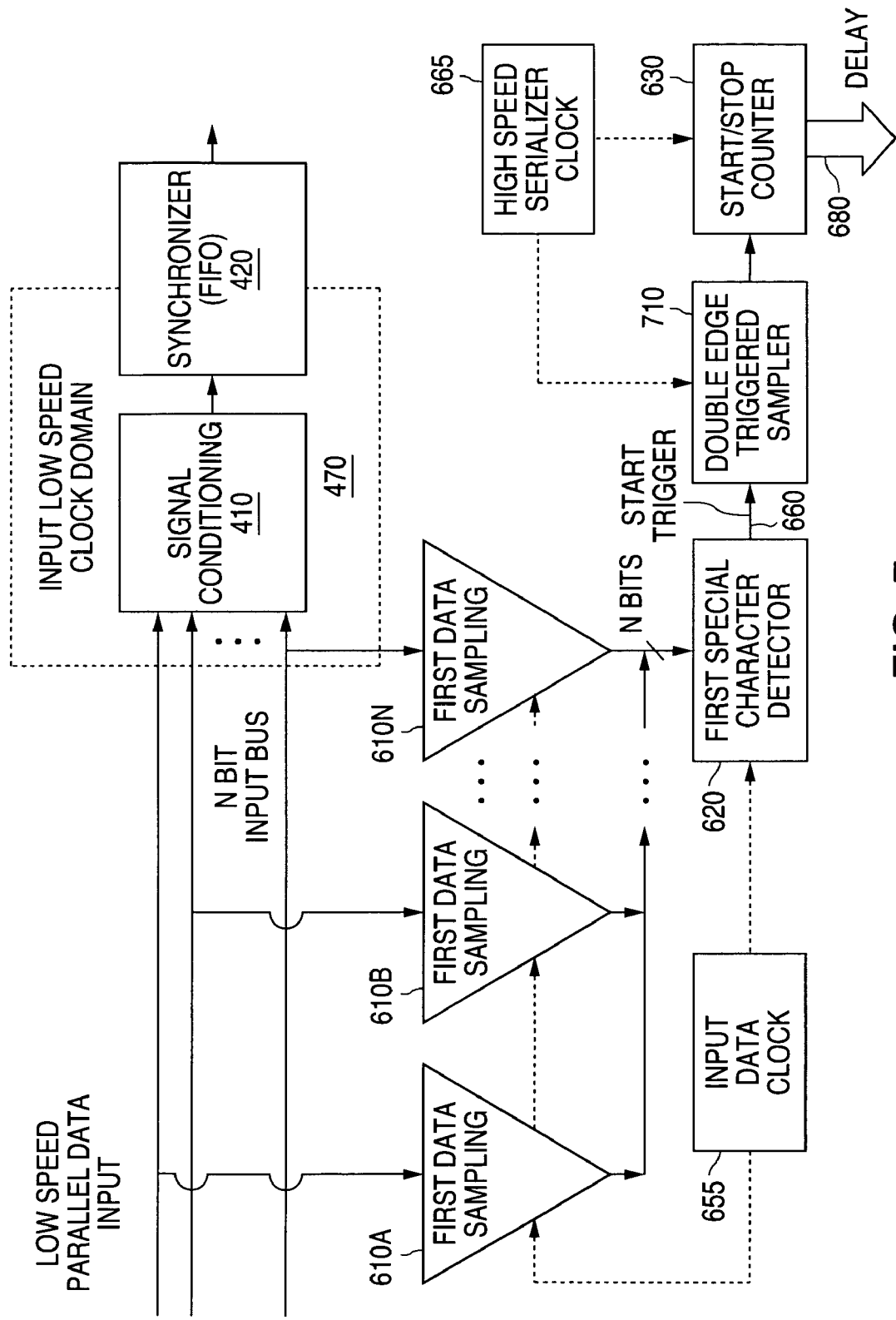
FIG. 7 illustrates a schematic diagram showing an advantageous embodiment of an input side of the data propagation delay measurement circuit shown in FIG. 6.
Figure 8:
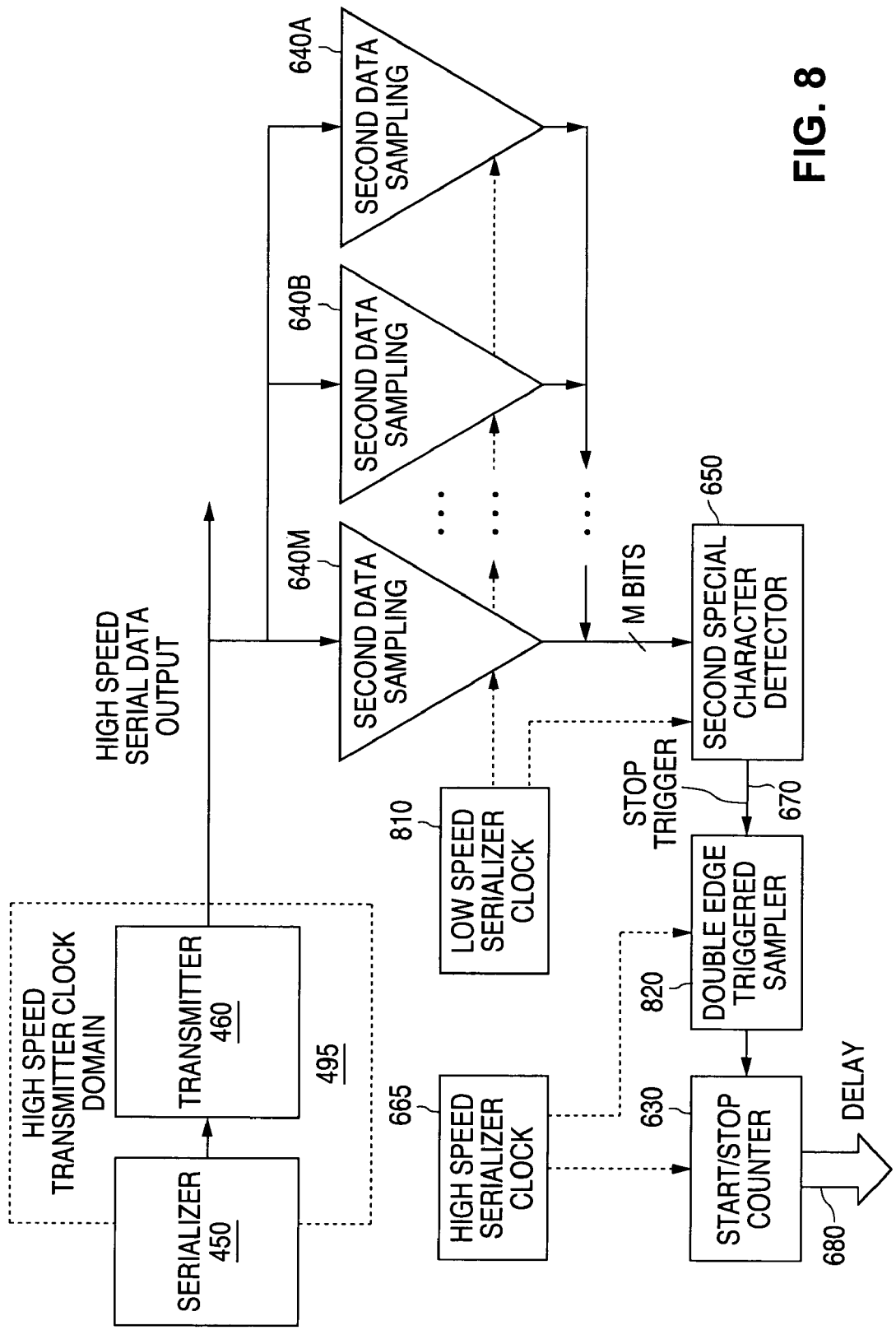
FIG. 8 illustrates a schematic diagram showing an advantageous embodiment of an output side of the data propagation delay measurement circuit shown in FIG. 6.

In one advantageous embodiment of the present invention the data is sampled at both ends of the transmit data path using identical strobed comparators. FIG. 7 illustrates a schematic diagram showing how strobed comparators (610A, 610B, 610N) are used in the first data sampling circuitry in the input side of the data propagation delay measurement circuit 600. FIG. 8 illustrates a schematic diagram showing how strobed comparators (640A, 640B, 640N) are used in the second data sampling circuitry in the output side of the data propagation delay measurement circuit 600.

First consider the circuitry that is shown in FIG. 7. Low speed parallel data is input to signal conditioning unit 410 on an N-bit input bus. Data from each of the N input data lines is sampled in N strobed comparators (610A, 610B, 610N). Each of the N strobed comparators is triggered by the input data clock 655. The N data bits are then examined in the first special character detector 620. The first special character detector 620 is also timed by the input data clock 655 to ensure that the first special character detector 620 is synchronous with the N strobed comparators. When the first special character detector 620 detects the special character then the first special character detector 620 generates and sends a start trigger signal 660 to double edge triggered sampler 710.

As shown in FIG. 7, both the double edge triggered sampler 710 and the start/stop counter 630 are timed by the high-speed serializer clock 665. Despite the fact that the input data clock 655 and the high-speed serializer clock 665 are asynchronous, the double edge triggered sampling action of double edge triggered sampler 710 ensures that the start trigger signal 660 is transferred into the high-speed serializer clock domain with a timing uncertainty of less than one cycle of the high-speed serializer clock 665. The double edge triggered sampler 710 sends the start trigger signal 660 to start/stop counter 630. Start/stop counter 630 then starts counting the pulses of high-speed serializer clock 665.

Now consider the circuitry that is shown in FIG. 8. High-speed serial data is output from transmitter 460 on a high-speed output bus. Because the data is in high-speed serial form, it has to be converted to a low speed parallel form. This is accomplished by sampling the high-speed serial data in M strobed comparators (640A, 640B, 640M). Each of the M strobed comparators is triggered by the low speed serializer clock 810 that is synchronized with the high-speed serial data stream. In one advantageous embodiment the M strobed comparators are triggered with ten equally spaced phases of the low speed serializer clock 810. The multi-phase low speed serializer clock 810 is readily available in the SERDES circuitry for the case of 8B/10B encoding. In other advantageous embodiments the M strobed comparators may be triggered by fewer than ten or by more than ten equally spaced phases of the low speed serializer clock 810.

The M data bits are then examined in the second special character detector 650. The second special character detector 650 is also timed by the low speed serializer clock 810 to ensure that the second special character detector 650 is synchronous with the M strobed comparators. The second special character detector 650 is substantially similar to the first special character detector 620. They differ in that the first special character detector 620 on the parallel input side detects the special character in its raw format and the second special character detector 650 on the serial output side detects the encoded format of the special character. The first special character detector 620 and the second special character detector 650 are similar in that (1) they are composed of gates from the same logic family, and (2) they are matched in their detection delay.

When the second special character detector 650 detects the encoded format of the special character then the second special character detector 650 generates and sends a stop trigger signal 670 to double edge triggered sampler 820.

As shown in FIG. 8, both the double edge triggered sampler 820 and the start/stop counter 630 are timed by the high-speed serializer clock 665. The double edge triggered sampling action of double edge triggered sampler 820 ensures that the stop trigger signal 670 is transferred into the high-speed serializer clock domain with a timing uncertainty of less than one cycle of the high-speed serializer clock 665. The double edge triggered sampler 820 sends the stop trigger signal 670 to start/stop counter 630. Start/stop counter 630 then stops counting the pulses of high-speed serializer clock 665 and outputs the value of delay 680 in the manner previously described.

The advantage of this embodiment of the present invention is that the same type of strobed comparators is used on the serial output end (640A, 640B, 640M) as are used on the parallel input end (610A, 610B, 610N). In one advantageous embodiment of the invention each of the strobed comparators on the serial output end (640A, 640B, 640M) samples every tenth bit of the serial output data stream. This reduces the speed demand on the serial output comparators (640A, 640B, 640M) and matches them with the parallel input comparators (610A, 610B, 610N) at the parallel input end.

The data propagation delay measurement circuit 600 of the present invention has been described above in connection with the transmit data path (410 through 460) of a SERDES circuit. The advantageous embodiment of the invention shown in FIG. 7 and in FIG. 8 measures the data propagation delay that is designated $T_{PS}$ in SERDES chip 220 shown in FIG. 3.

Figure 9:
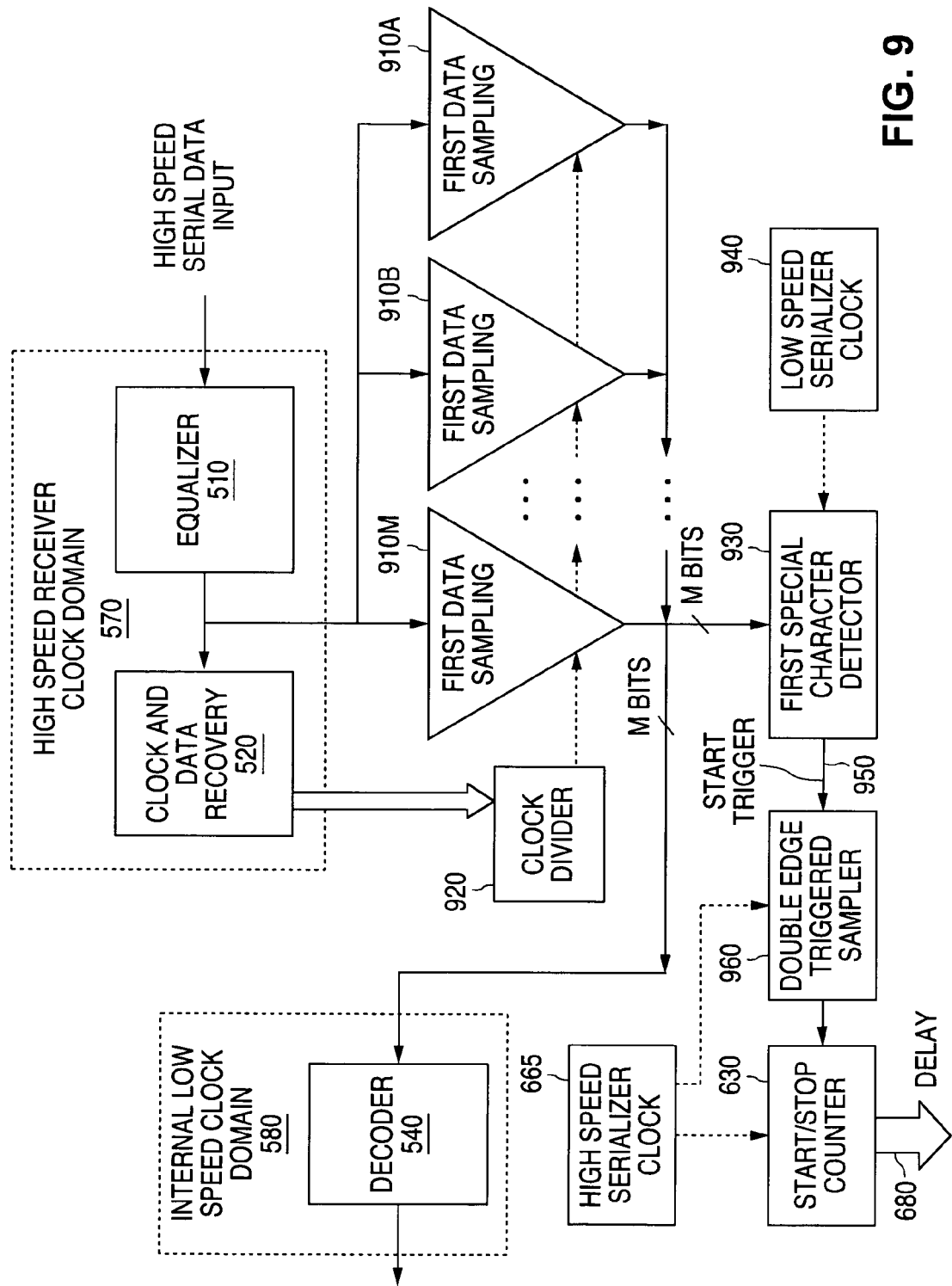
FIG. 9 illustrates a schematic diagram showing an advantageous embodiment of an input side of a data propagation delay measurement circuit of the present invention for measuring on-chip data propagation delay in a receive data path of a SERDES integrated circuit chip.
Figure 10:
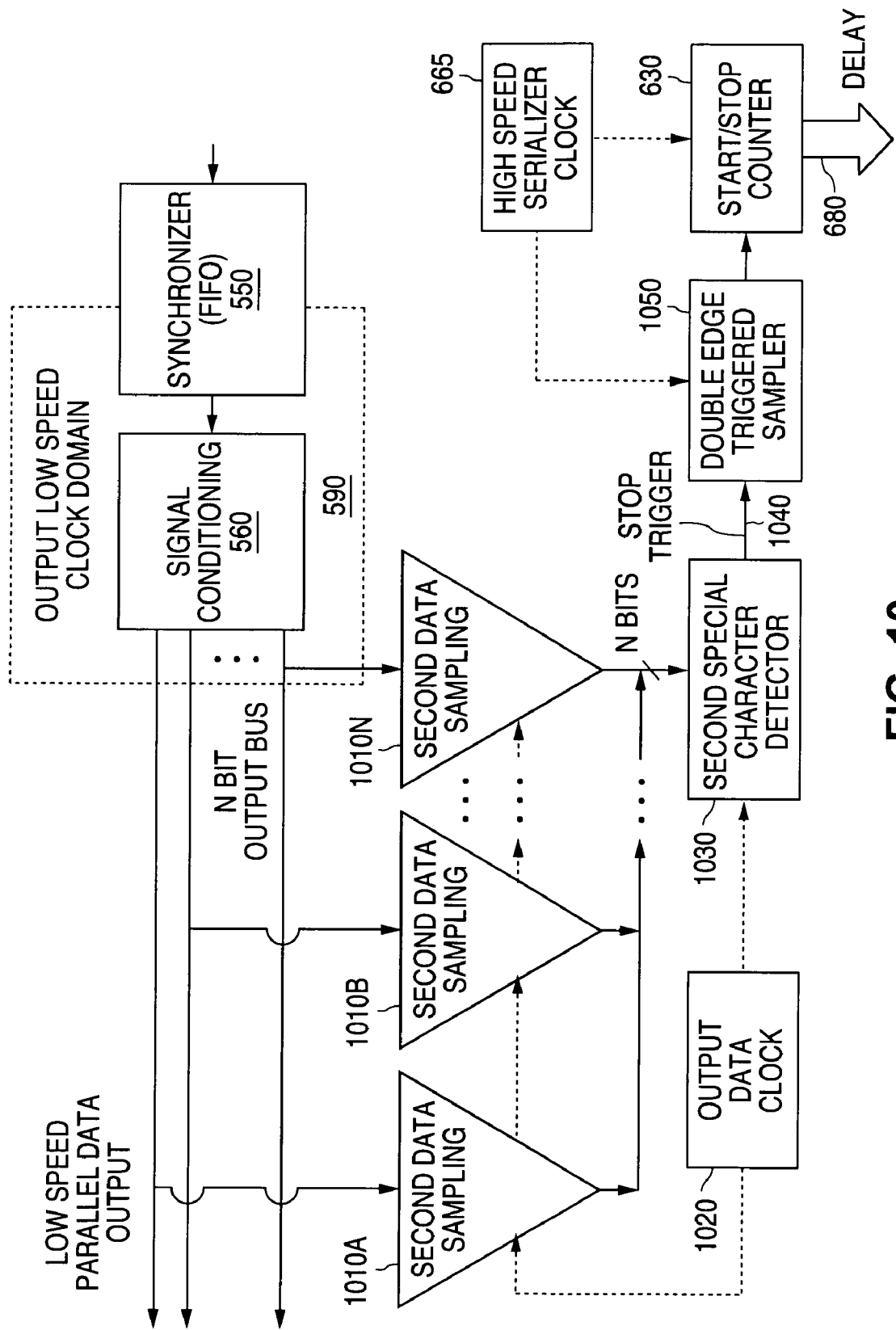
FIG. 10 illustrates a schematic diagram showing an advantageous embodiment of an output side of a data propagation delay measurement circuit of the present invention for measuring on-chip data propagation delay in a receive data path of a SERDES integrated circuit chip.

The data propagation delay measurement circuit 600 of the present invention also be used to measure on-chip data propagation delay in a receive data path (510 through 560) of a SERDES circuit. FIG. 9 illustrates a schematic diagram showing an advantageous embodiment of an input side of a data propagation delay measurement circuit 600 for measuring on-chip data propagation delay in a receive data path of a SERDES circuit. FIG. 10 illustrates a schematic diagram showing an advantageous embodiment of an output side of a data propagation delay measurement circuit 600 for measuring on-chip data propagation delay in a receive data path of a SERDES integrated circuit chip. The advantageous embodiment of the invention shown in FIG. 9 and in FIG. 10 measures the data propagation delay that is designated $T_{SP}$ in SERDES chip 220 shown in FIG. 3.

The delay measurement technique of the invention that is used in the receive data path is similar to the delay measurement technique of the invention that is used in the transmit data path. However, there is one critical difference. The incoming high-speed serial data has an unknown phase and unknown frequency. This means that the strobed comparators (910A, 910B, 910M) shown in FIG. 9 must rely on the recovered clock signal from the clock and data recovery (CDR) unit 520 (subsequently divided by clock divider 920) in order to sample the input data stream.

An additional complication is that the recovered clock signal run at a high speed that is matched to the high speed of the incoming data. However, the strobed comparators (910A, 910B, 910M) require multiple phases of a clock that is running at the same speed as that of the parallel output end of the receive data path. In the case of 8B/10B encoding, this means that the strobed comparators (910A, 910B, 910M) need ten phases running at one tenth of the high-speed incoming data rate.

The required phases must be generated in a way that ensures that the incoming data is correctly sampled. In one advantageous embodiment of the invention, a multi-phase, slow speed clock is produced that is synchronous with the high-speed incoming data by generating multiple phases with a delay lock loop (DLL) (not shown in FIG. 9). The delay lock loop (DLL) can produce equally spaced phases with a fifty percent (50%) duty cycle. The operation of the delay lock loop (DLL) can be controlled to a high degree. The delay lock loop (DLL) ensures proper adjustment of the delays with process, temperature, or voltage variations.

In another advantageous embodiment of the invention, a multi-phase, slow speed clock is produced with a clock divider 920. Clock divider 920 receives the recovered clock signal from clock and data recovery (CDR) unit 520. In the case of 8B/10B encoding, the clock divider 920 can divide the high-speed recovered clock signal by ten in order to generate the required low speed clock signal. At the same time, the clock divider 920 also generates the ten phases required for the delay measurement system of the M strobed comparators (910A, 910B, 910M). The drawback of this embodiment is that the ten phases of the slow speed clock do not have a fifty percent (50%) duty cycle. This is generally not a problem if the M strobed comparators (910A, 910B, 910M) are able to sample the data with sufficient speed.

After the required phases have been generated, the M strobed comparators (910A, 910B, 910M) are used to sample the high-speed serial input data stream to generate a parallel representation (M bits) to be fed into the first special character detector 930. The first special character detector 930 is timed by low speed serializer clock 940.

When the first special character detector 930 detects a special character in the data input stream then the first special character detector 620 generates and sends a start trigger signal 950 to double edge triggered sampler 960. As shown in FIG. 9, both the double edge triggered sampler 960 and the start/stop counter 630 are timed by the high-speed serializer clock 665. The double edge triggered sampling action of double edge triggered sampler 960 ensures that the start trigger signal 950 is transferred into the high-speed serializer clock domain with a timing uncertainty of less than one cycle of the high-speed serializer clock 665. The double edge triggered sampler 960 sends the start trigger signal 950 to start/stop counter 630. Start/stop counter 630 then starts counting the pulses of high-speed serializer clock 665.

The embodiment of the invention shown in FIG. 9 has an additional advantage. There is no need for a deserializer unit (i.e., the deserializer unit 530 shown in FIG. 5) at the high-speed input end of the receive data path (510 through 560). Because the strobed comparators (910A, 910B, 910M) are triggered by the recovered clock signal and sample the incoming data in parallel, the outputs (M bits) of the strobed comparators (910A, 910B, 910M) already represent a deserialized version of the recovered data. This deserialized version of the recovered data is ready to be delivered to decoder 540 of the internal low speed clock domain 580. FIG. 9 illustrates how the outputs (M bits) of the strobed comparators (910A, 910B, 910M) are provided to the encoder 540.

Accordingly, there is no separate deserializer unit 530 shown in FIG. 9. The absence of deserializer unit 530 in the present invention simplifies the overall SERDES chip design and reduces the power and area requirements that would otherwise be needed to separately perform the deserialization functions.

As shown in FIG. 9, the deserialization functions of this embodiment of the present invention are now performed by the delay measurement circuitry of the strobed comparators (910A, 910B, 910M). Note that the input to the strobed comparators (910A, 910B, 910M) comes from the output of equalizer 510. Therefore, the delay measured by the strobed comparators (910A, 910B, 910M) does not include the delay due to equalizer 510. Bypassing equalizer 510 improves the delay measurement ability of the strobed capacitors (910A, 910B, 910M). However, the value of the equalizer delay of equalizer 510 is well characterized and is a known quantity. The known value of the equalizer delay is provided to the on-chip digital processor (not shown) that calculates the final value of the delay through the receive data path. The on-chip digital processor simply adds the value of the equalizer delay to the value of delay 680 that is provided to the on-chip digital processor by start/stop counter 630 for a receive data path.

FIG. 10 illustrates a schematic diagram showing an advantageous embodiment of an output side of a data propagation delay measurement circuit 600 for measuring on-chip data propagation delay in a receive data path of a SERDES circuit. Low speed parallel data is output on an N-bit output bus from signal conditioning unit 560 of the receive data path. Data from each of the N output data lines is sampled in N strobed comparators (1010A, 10101B, 1010N). Each of the N strobed comparators is triggered by the output data clock 1020. The N data bits are then examined in the second special character detector 1030. The second special character detector 1030 is also timed by the output data clock 1020 to ensure that the second special character detector 1030 is synchronous with the N strobed comparators. When the second special character detector 1030 detects the special character then the second special character detector 1030 generates and sends a stop trigger signal 1040 to double edge triggered sampler 1050.

As shown in FIG. 10, both the double edge triggered sampler 1050 and the start/stop counter 630 are timed by the high-speed serializer clock 665. Despite the fact that the output data clock 1020 and the high-speed serializer clock 665 are asynchronous, the double edge triggered sampling action of double edge triggered sampler 1050 ensures that the stop trigger signal 1040 is transferred into the high-speed serializer clock domain with a timing uncertainty of less than one cycle of the high-speed serializer clock 665. The double edge triggered sampler 1050 sends the stop trigger signal 1040 to start/stop counter 630. Start/stop counter 630 then stops counting the pulses of high-speed serializer clock 665 and outputs the value of delay 680 in the manner previously described.

Figure 11:
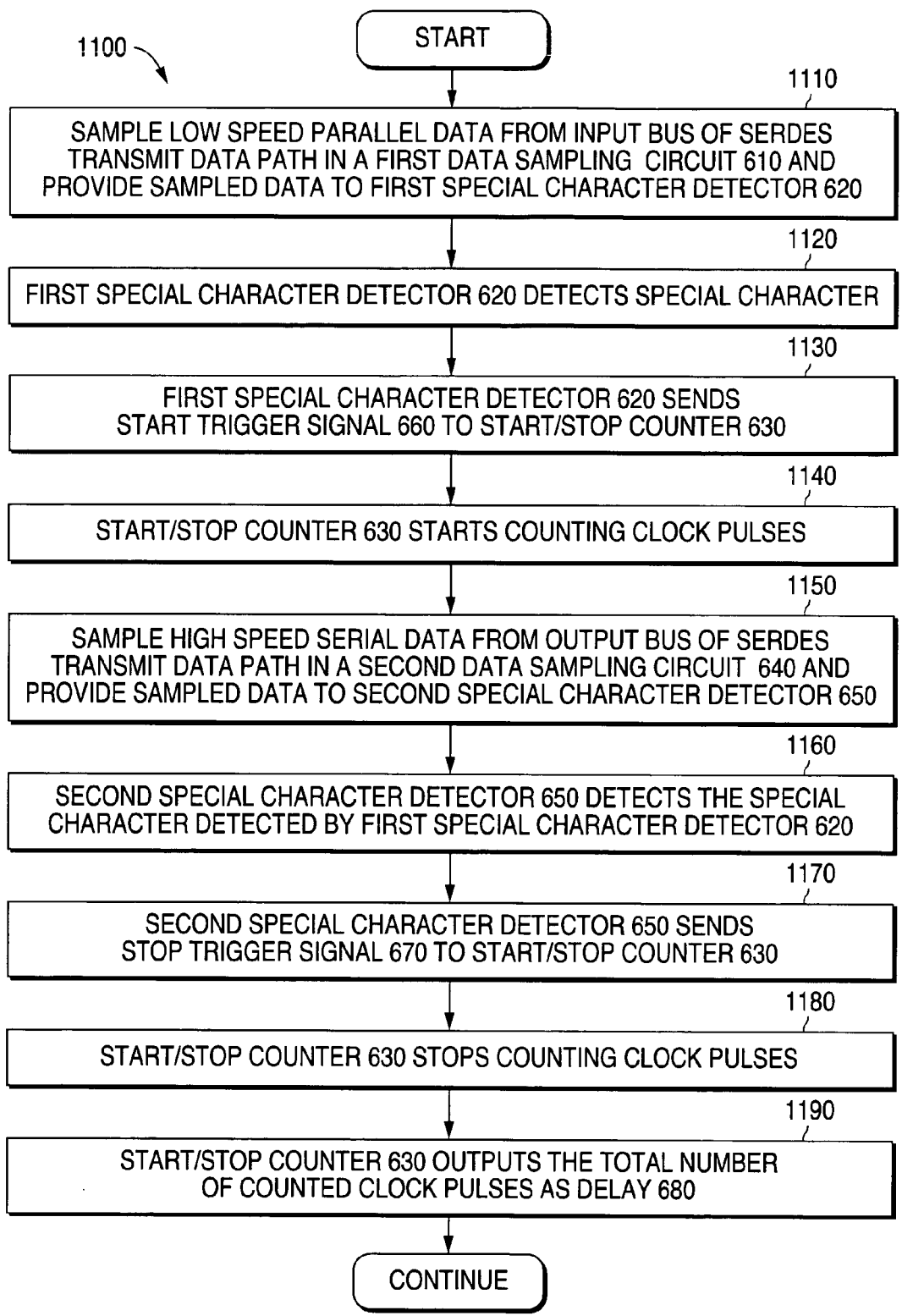
FIG. 11 illustrates a flowchart showing the steps of an advantageous embodiment of the method of the present invention.

FIG. 11 illustrates a flowchart 1100 showing the steps of an advantageous embodiment of the method of the present invention. Low speed parallel data from a parallel data input bus of a SERDES transmit data path is sampled in a first data sampling circuit 610 and the sampled data is provided to a first special character detector 620 (step 1110). Then the first special character detector 620 detects a special character (step 1120). The first special character detector 620 then sends a start trigger signal 660 to start/stop counter 630 (step 1130).

The start/stop counter 630 then starts counting the clock pulses of high-speed serializer clock 665 (step 1140).

High-speed serial data from a serial data output bus of the SERDES transmit data path is sampled in a second data sampling circuit 640 and the sampled data is provided to a second special character detector 650 (step 1150). Then the second special character detector 650 detects the special character that was detected by the first special character detector 620 (step 1160). The second special character detector 650 then sends a stop trigger signal 670 to start/stop counter 630 (step 1170). The start/stop counter 630 then stops counting the clock pulses of high-speed serializer clock 665 (step 1180). The start/stop counter 630 then outputs the total number of counted clock pulses as delay 680 (step 1190).

Figure 12:
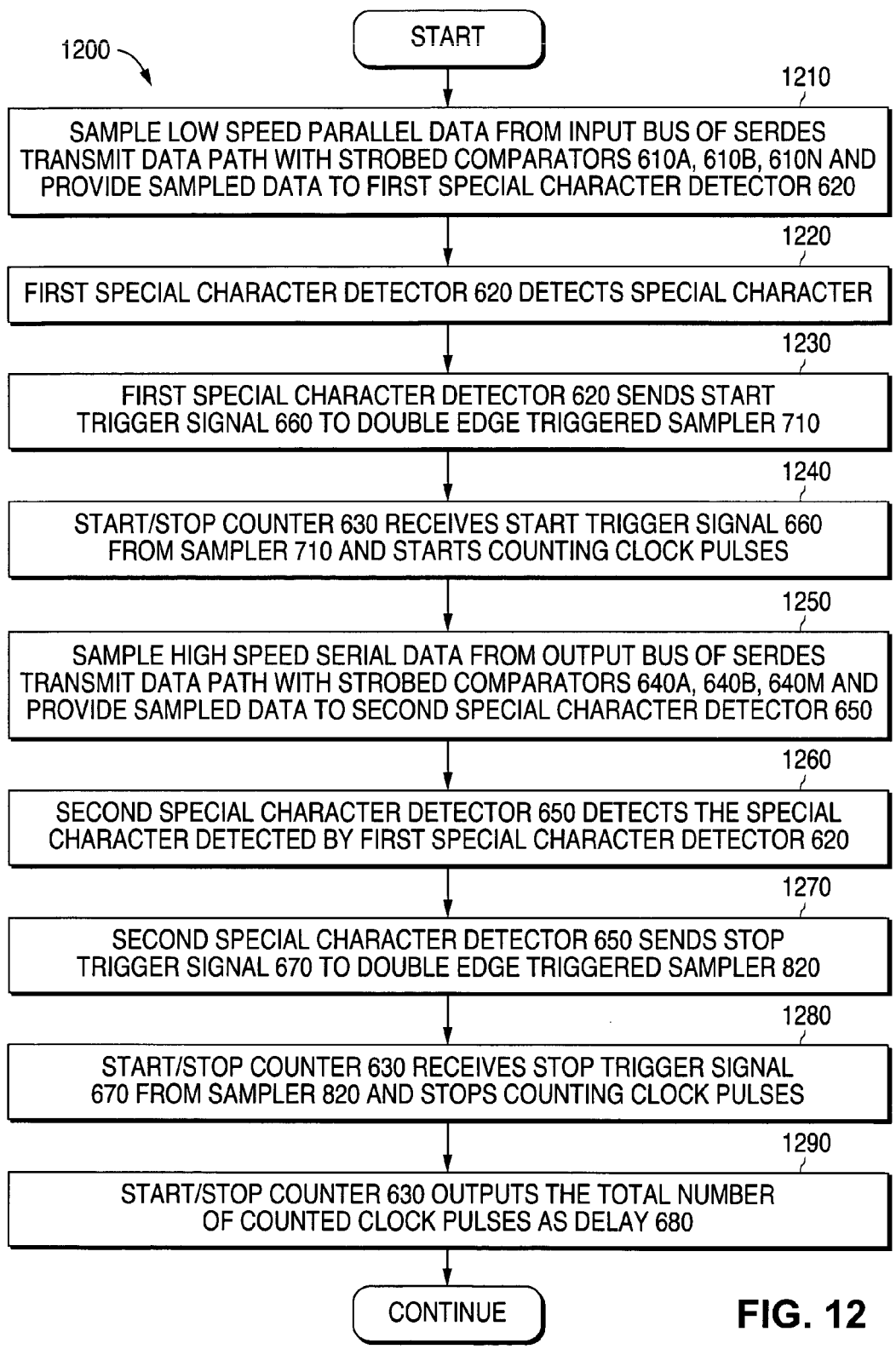
FIG. 12 illustrates a flowchart showing the steps of another advantageous embodiment of the method of the present invention.

FIG. 12 illustrates a flowchart 1200 showing the steps of another advantageous embodiment of the method of the present invention. Low speed parallel data from a parallel data input bus of a SERDES transmit data path is sampled with a plurality of strobed comparators (610A, 610B, 610N) and the sampled data is provided to a first special character detector 620 (step 1210). Then the first special character detector 620 detects a special character (step 1220). The first special character detector 620 then sends a start trigger signal 660 to double edge triggered sampler 710 (step 1230). The double edge triggered sampler 710 sends the start trigger signal 660 to start/stop counter 630 and the start/stop counter 630 starts counting the clock pulses of high-speed serializer clock 665 (step 1240).

High-speed serial data from a serial data output bus of the SERDES transmit data path is sampled with a plurality of strobed comparators (640A, 640B, 640M) and the sampled data is provided to a second special character detector 650 (step 1250). Then the second special character detector 650 detects the special character that was detected by the first special character detector 620 (step 1260). The second special character detector 650 then sends a stop trigger signal 670 to double edge triggered sampler 820 (step 1270). The double edge triggered sampler 710 sends the stop trigger signal 670 to start/stop counter 630 and the start/stop counter 630 stops counting the clock pulses of high-speed serializer clock 665 (step 1280). The start/stop counter 630 then outputs the total number of counted clock pulses as delay 680 (step 1290).

Figure 13:
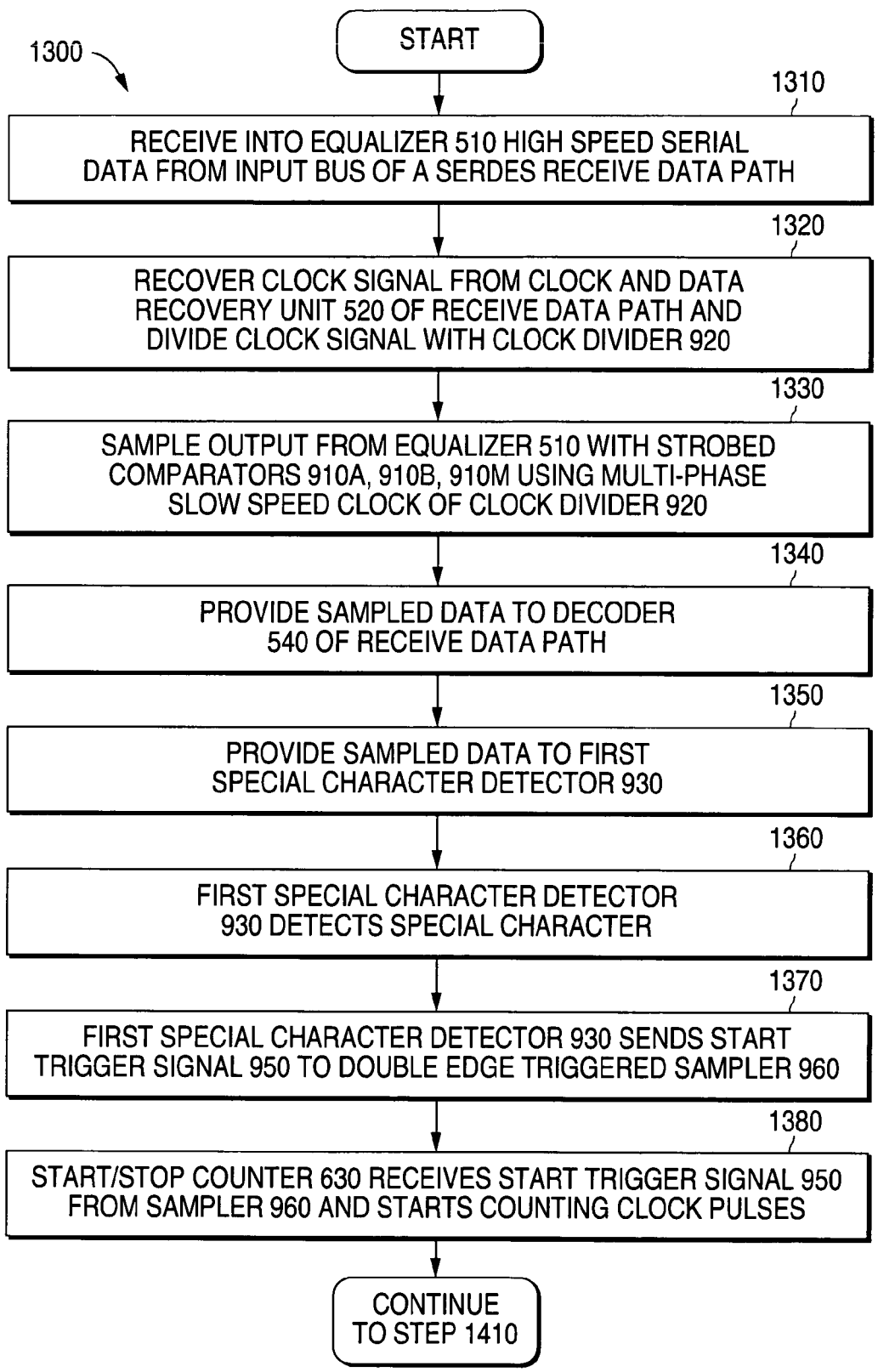
FIG. 13 illustrates a flowchart showing the steps of a first portion of another advantageous embodiment of the method of the present invention.

FIG. 13 illustrates a flowchart 1300 showing the steps of a first portion of another advantageous embodiment of the method of the present invention. High-speed serial data from an input bus of a SERDES receive data path is received into an equalizer 510 (step 1310). The clock signal is recovered from the clock and data recovery unit 520 of the receive data path and the recovered clock signal is divided by clock divider 920 (step 1320). The output of equalizer 510 is sampled with strobed comparators 910A, 910B, 910M using the multiphase slow speed clock that is provided by clock divider 920 (step 1330).

The sampled data from the strobed comparators 910A, 910B, 910M is provided to decoder 540 of the receive data path (step 1340). The sampled data from the strobed comparators 910A, 910B, 910M is also provided to first special character detector 930 (step 1350). Then first special character detector 930 detects a special character (step 1360). First special character detector 930 then sends a start trigger signal 950 to double edge triggered sampler 960 (step 1370). The double edge triggered sampler 960 sends the start trigger signal 950 to start/stop counter 630 and the start/stop counter 630 starts counting the clock pulses of high-speed serializer clock 665 (step 1380). Control then passes to step 1410 of FIG. 14.

Figure 14:
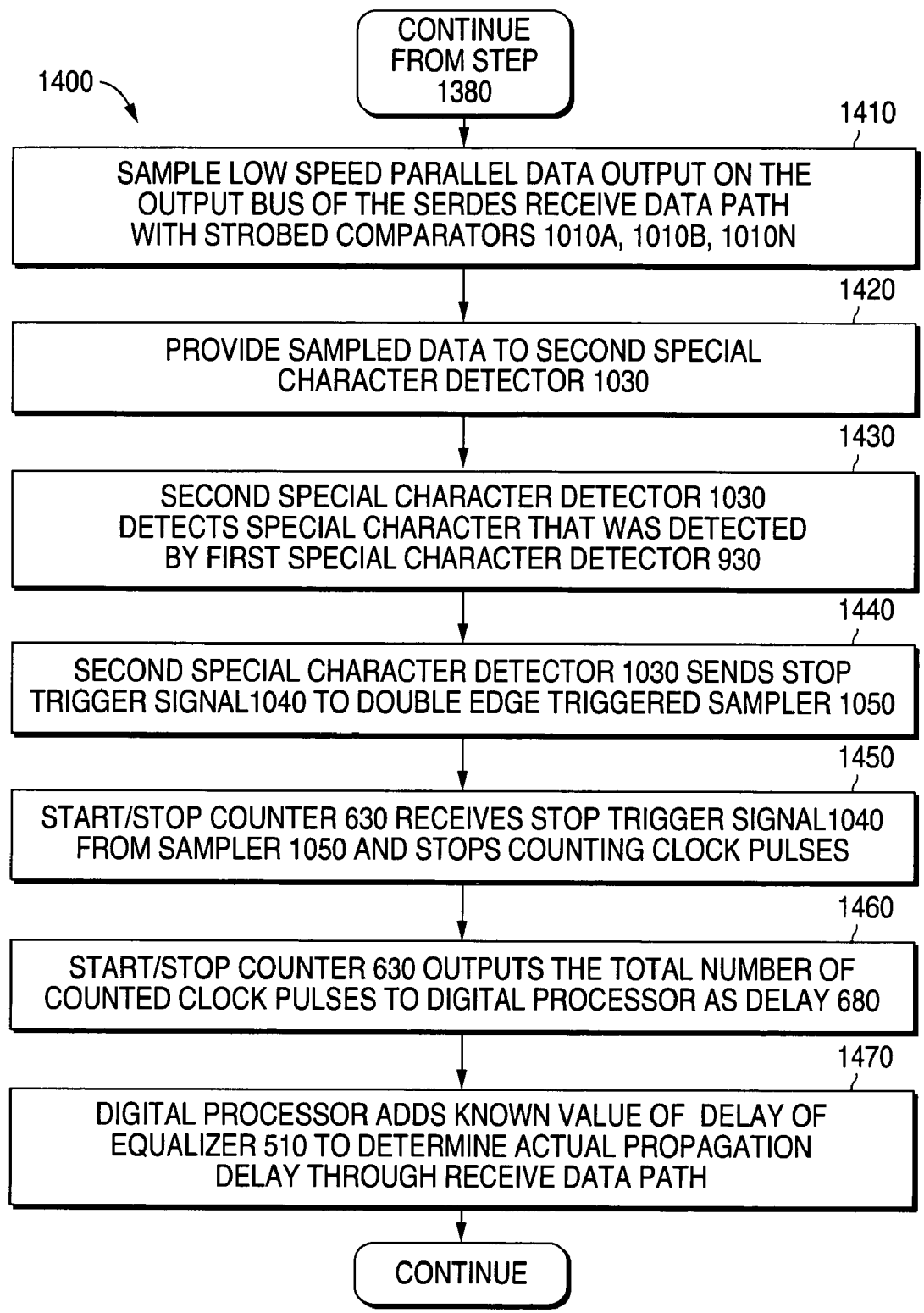
FIG. 14 illustrates a flowchart showing the steps of a second portion of the advantageous embodiment of the method of the present invention shown in FIG. 13.

FIG. 14 illustrates a flowchart 1400 showing the steps of a second portion of the advantageous embodiment of the method of the present invention shown in FIG. 13. Control passes from step 1380 of FIG. 13. Low speed parallel data that is output on the output bus of the SERDES receive data path is sampled with strobed comparators 1010A, 1010B, 1010N (step 1410). The sampled data is provided to second special character detector 1030 (step 1420). Then the second special character detector 1030 detects the special character that was detected by the first special character detector 930 (step 1430).

The second special character detector 1030 then sends a stop trigger signal 1040 to double edge triggered sampler 1050 (step 1440). The double edge triggered sampler 1050 sends the stop trigger signal 1040 to start/stop counter 630 and the start/stop counter 630 stops counting the clock pulses of high-speed serializer clock 665 (step 1450).

The start/stop counter 630 outputs the total number of counted clock pulses to a digital processor (not shown) as delay 680 (step 1460). The digital processor then adds a known value of delay of equalizer 510 to the time represented by the counted clock pulses in order to determine the actual propagation delay through the receive data path (step 1470).

Figure 3:
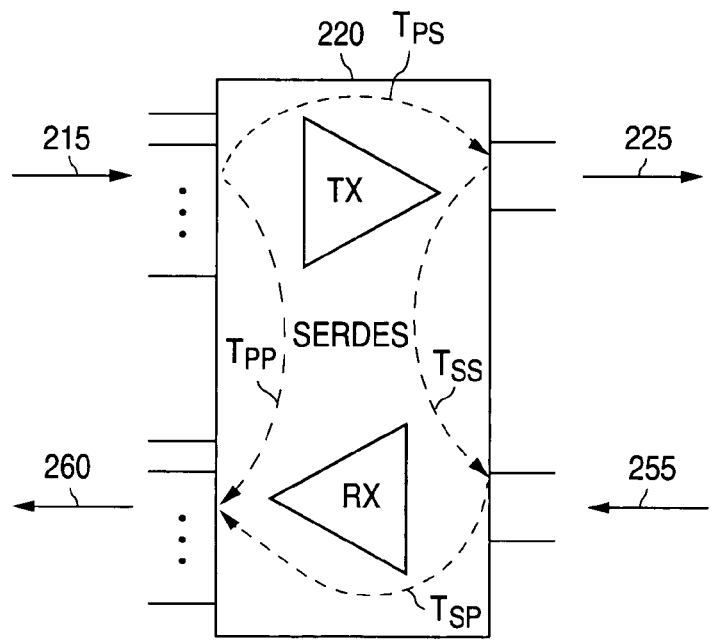
FIG. 3 illustrates a schematic diagram of a prior art SERDES integrated circuit chip showing four types of data propagation delays.
Figure 2:
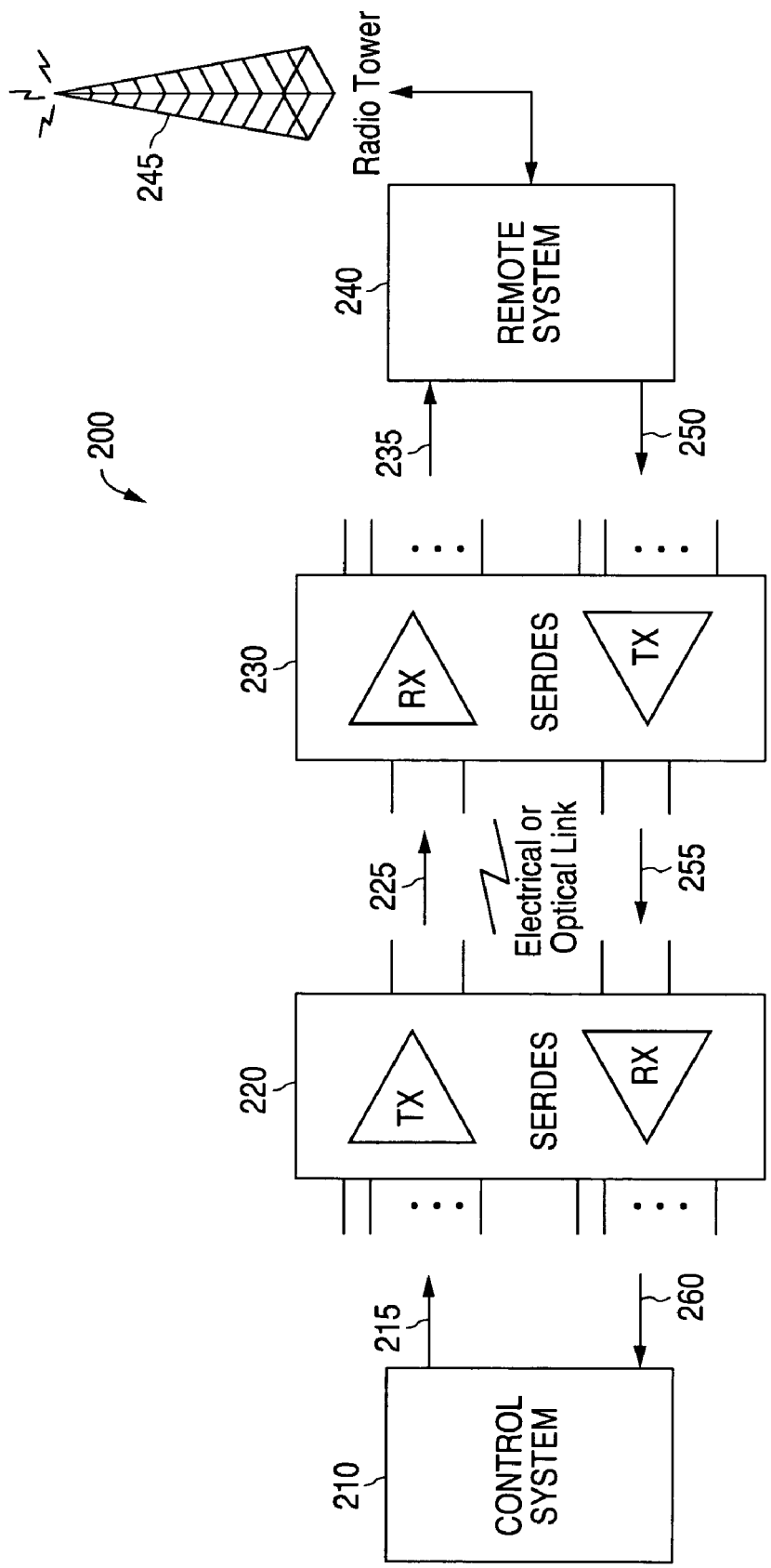
FIG. 2 illustrates a schematic diagram showing how two prior art SERDES integrated circuit chips may employed in a cellular mobile base station.
Figure 4:
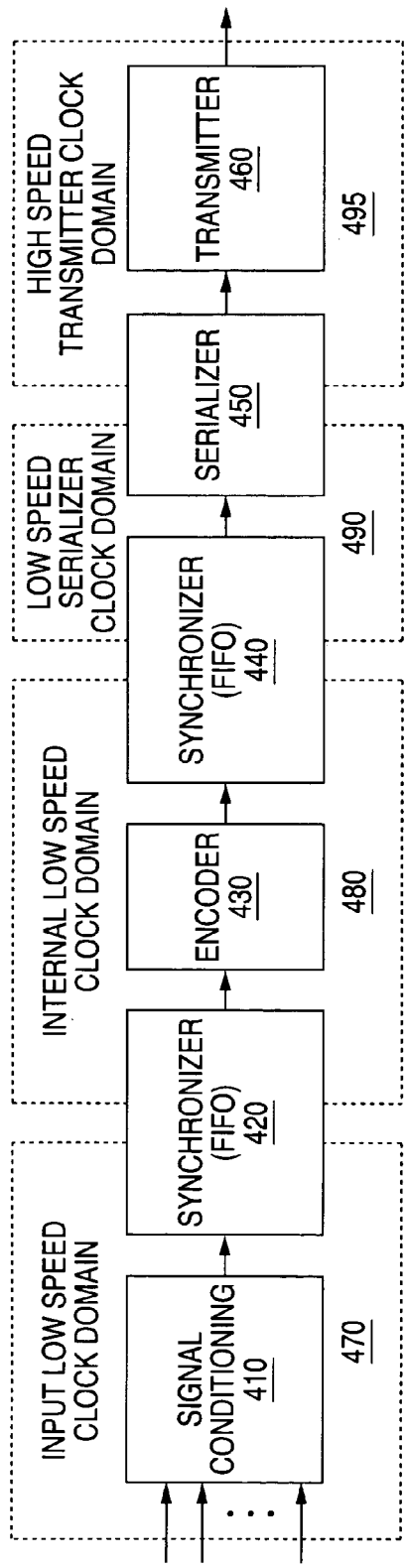
FIG. 4 illustrates an exemplary transmit data path within a prior art SERDES integrated circuit chip.
Figure 5:
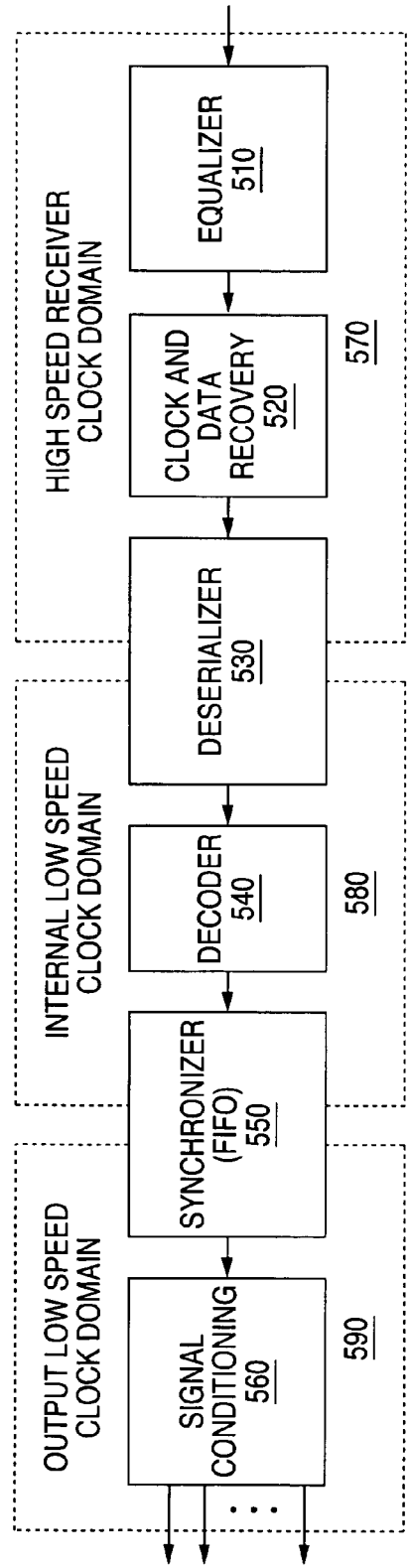
FIG. 5 illustrates an exemplary receive data path within a prior art SERDES integrated circuit chip.

The circuitry and method of the present invention may also be used to measure the data propagation delays that are designated $T_{PP}$ and $T_{SS}$ in the SERDES chip 220 shown in FIG. 3.

In order to measure the data propagation delay $T_{PP}$, the data samplers 610 at the input parallel bus are used to deliver data to the first special character detector 620 that will trigger the start/stop counter 630 at the appropriate moment to begin counting. The data is then looped back within the SERDES chip or across the link. The data samplers 1010 at the output parallel bus deliver the data to the second special character detector 1030. The second special character detector 1030 then triggers the start/stop counter 630 to stop counting. The data propagation delay $T_{PP}$ may then be computed from the value of the delay 680.

In order to measure the data propagation delay $T_{SS}$, the data samplers 910 at the input serial bus are used to deliver data to the first special character detector 930 that will trigger the start/stop counter 630 at the appropriate moment to begin counting. The data is then looped back within the SERDES chip or across the link. The data samplers 640 at the output serial bus deliver the data to the second special character detector 650. The second special character detector 650 then triggers the start/stop counter 630 to stop counting. The data propagation delay $T_{SS}$ may then be computed from the value of the delay 680.

In the manner described above, the circuitry and method of the present invention is capable of measuring the data propagation delay between any two ports of the four ports of a SERDES chip. For example, the following delays from the input parallel port can be measured: (1) the delay from the input parallel port to the output serial port, and (2) the delay from the input parallel port to the input serial port, and (3) the delay from the input parallel port to the output parallel port. Measuring the delay from the input parallel port to the input serial port requires that the data be looped back either internally or across the serial link. Measuring the delay from the input parallel port to the output parallel port requires that the data be looped back internally.

Similarly, delays can be measured from each of the other three ports using internal or external data loop back as needed. That is, delays from the output parallel port to each of the other three ports can be measured. Delays from the output serial port to each of the other three ports can be measured. Delays from the input serial port to each of the other three ports can be measured.

As previously mentioned, the capability provided by the circuitry and method of the present invention allows a user to measure external propagation delays such as the delays that exist across an electrical or optical link between two SERDES chips.

Although the present invention has been described with an exemplary embodiment, various changes and modifications may be suggested to one skilled in the art. It is intended that the present invention encompass such changes and modifications as fall within the scope of the appended claims.

What is claimed is:

1. A data propagation delay measurement circuit for measuring on-chip data propagation delay in a transmit data path of a serializer/deserializer circuit, said data propagation delay measurement circuit comprising:
   means for detecting a special character that is present at an input of said transmit data path;
   means for detecting said special character at an output of said transmit data path; and
   means for obtaining a period of time that said special character spends within said transmit data path.

2. The data propagation delay measurement circuit as set forth in claim 1 wherein said means for detecting said special character that is present at said input of said transmit data path comprises:
   a first data sampling circuit coupled to said input of said transmit data path; and
   a first special character detector coupled to an output of said first data sampling circuit wherein said first special character detector creates a start trigger signal when said first special character detector detects said special character.

3. The data propagation delay measurement circuit as set forth in claim 2 wherein said means for detecting said special character at said output of said transmit data path comprises:
   a second data sampling circuit coupled to said output of said transmit data path; and
   a second special character detector coupled to an output of said second data sampling circuit wherein said second special character detector creates a stop trigger signal when said second special character detector detects said special character.

4. The data propagation delay measurement circuit as set forth in claim 3 wherein said means for obtaining said period of time that said special character spends within said transmit data path comprises:
   a start/stop counter that has a first input coupled to an output of said first special character detector for receiving said start trigger signal and having a second input coupled to an output of said second special character detector for receiving said stop trigger signal; and
   a high-speed clock circuit coupled to a third input of said start/stop counter for providing high-speed clock pulses to said start/stop counter.

5. The data propagation delay measurement circuit as set forth in claim 4 wherein
   said start/stop counter starts counting high-speed clock pulses from said high-speed clock circuit when said start/stop counter receives said start trigger signal;
   said start/stop counter stops counting high-speed clock pulses from said high-speed clock circuit when said start/stop counter receives said stop trigger signal; and said start/stop counter outputs a counted number of high-speed clock pulses that represent said period of time that said special character spends within said transmit data path.

6. The data propagation delay measurement circuit as set forth in claim 5 wherein
said first data sampling circuit coupled to said input of said transmit data path comprises a first plurality of strobed comparators; and
said second data sampling circuit coupled to said output of said transmit data path comprises a second plurality of strobed comparators.

7. The data propagation delay measurement circuit as set forth in claim 3 wherein a value of signal propagation delay through an input side of said data propagation delay measurement circuit comprising said first data sampling circuit and said first special character detector is matched to a value of signal propagation delay through an output side of said data propagation delay measurement circuit comprising said second data sampling circuit and said second special character detector.

8. The data propagation delay measurement circuit as set forth in claim 7 wherein identical circuitry is used for said input side and for said output side of said data propagation delay measurement circuit.

9. The data propagation delay measurement circuit as set forth in claim 8 wherein a propagation delay of said start trigger signal is matched to a propagation delay of said stop trigger signal.

10. The data propagation delay measurement circuit as set forth in claim 3 wherein said means for obtaining said period of time that said special character spends within said transmit data path comprises:
a first double edge triggered sampler having a first input coupled to an output of said first special character detector for receiving said start trigger signal from said first special character detector;
a second double edge triggered sampler having a first input coupled to an output of said second special character detector for receiving said stop trigger signal from said second special character detector;
a start/stop counter that has a first input coupled to an output of said first double edge triggered sampler for receiving said start trigger signal and having a second input coupled to an output of said second double edge triggered signal for receiving said stop trigger signal; and
a high-speed clock circuit that is coupled to a third input of said start/stop counter for providing high-speed clock pulses to said start/stop counter, and that is coupled to a second input of said first double edge triggered sampler, and that is coupled to a second input of said second double edge triggered sampler.

11. The data propagation delay measurement circuit as set forth in claim 10 wherein
said first double edge triggered sampler transfers said start trigger signal into said start/stop counter with a timing uncertainty that is less than one cycle of said high-speed clock circuit; and
said second double edge triggered sampler transfers said stop trigger signal into said start/stop counter with a timing uncertainty that is less than one cycle of said high-speed clock circuit.

12. The data propagation delay measurement circuit as set forth in claim 11 wherein
said start/stop counter starts counting high-speed clock pulses from said high-speed clock circuit when said start/stop counter receives said start trigger signal from said first double edge triggered sampler;
said start/stop counter stops counting high-speed clock pulses from said high-speed clock circuit when said start/stop counter receives said stop trigger signal from said second double edge triggered sampler; and
said start/stop counter outputs a counted number of high-speed clock pulses that represent said period of time that said special character spends within said transmit data path.

13. A method for measuring on-chip data propagation delay in a transmit data path of a serializer/deserializer circuit, said method comprising the steps of:
detecting a special character that is present at an input of said transmit data path;
detecting said special character at an output of said transmit data path; and
obtaining a period of time that said special character spends within said transmit data path.

14. The method as set forth in claim 13 wherein said step of detecting said special character that is present at said input of said transmit data path comprises the steps of:
sampling said input of said transmit data path in a first data sampling circuit;
detecting said special character in said sampled input of said transmit data path in a first special character detector coupled to an output of said first data sampling circuit; and
creating in said first special character detector a start trigger signal when said first special character detector detects said special character.

15. The method as set forth in claim 14 wherein said step of detecting said special character at said output of said transmit data path comprises the steps of:
sampling said output of said transmit data path in a second data sampling circuit;
detecting said special character in said sampled output of said transmit data path in a second special character detector coupled to an output of said second data sampling circuit; and
creating in said second special character detector a stop trigger signal when said second special character detector detects said special character.

16. The method as set forth in claim 15 wherein said step of obtaining said period of time that said special character spends within said transmit data path comprises the steps of:
receiving said start trigger signal in a start/stop counter that has a first input coupled to an output of said first special character detector;
receiving said stop trigger signal in said start/stop counter that has a second input coupled to an output of said second special character detector; and
receiving high-speed clock pulses in said start/stop counter from a high-speed clock circuit coupled to said start/stop counter.

17. The method as set forth in claim 16 further comprising the steps of:
starting counting in said start/stop counter high-speed clock pulses when said start/stop counter receives said start trigger signal;
stopping counting in said start/stop counter high-speed clock pulses when said start/stop counter receives said stop trigger signal; and
outputting from said start/stop counter a counted number of high-speed clock pulses that represent said period of time that said special character spends within said transmit data path.

18. The method as set forth in claim 17 further comprising the steps of:
- sampling said input of said transmit data path in said first data sampling circuit using a first plurality of strobed comparators; and
- sampling said output of said transmit data path in said second data sampling circuit using a second plurality of strobed comparators.

19. The method as set forth in claim 18 further comprising the steps of:
- transferring said start trigger signal into said start/stop counter from a first double edge triggered sampler coupled to said first special character detector, wherein said start trigger signal has a timing uncertainty that is less than one cycle of said high-speed clock circuit; and
- transferring said stop trigger signal into said start/stop counter from a second double edge triggered sampler coupled to said second special character detector, wherein said stop trigger signal has a timing uncertainty that is less than one cycle of said high-speed clock circuit.

20. A data propagation delay measurement circuit for measuring on-chip data propagation delay in a receive data path of a serializer/deserializer circuit, said data propagation delay measurement circuit comprising:
- means for detecting a special character that is present at an output of an equalizer at an input of said receive data path;
- means for detecting said special character at an output of said receive data path; and
- means for obtaining a period of time that said special character spends within said receive data path excluding said equalizer.

21. The data propagation delay measurement circuit as set forth in claim 20 wherein said means for detecting said special character that is present at said output of said equalizer of said receive data path comprises:
- a clock divider circuit having an input coupled to an output of a clock and data recovery unit of said receive data path;
- a first plurality of strobed comparators having inputs coupled to said output of said equalizer and clocked with a multi-phase, slow speed clock produced by said clock divider circuit; and
- a first special character detector coupled to an output of said first plurality of strobed detectors wherein said first special character detector creates a start trigger signal when said first special character detector detects said special character.

22. The data propagation delay measurement circuit as set forth in claim 21 wherein said output of said first plurality of strobed detectors is provided directly to a decoder unit of said receive data path.

23. The data propagation delay measurement circuit as set forth in claim 22 wherein said means for detecting said special character at said output of said receive data path comprises:
- a second plurality of strobed comparators coupled to said output of said receive data path; and
- a second special character detector coupled to an output of said second plurality of strobed comparators wherein said second special character detector creates a stop trigger signal when said second special character detector detects said special character.

24. The data propagation delay measurement circuit as set forth in claim 23 wherein said means for obtaining said period of time that said special character spends within said receive data path excluding said equalizer comprises:
- a start/stop counter that has a first input coupled to an output of said first special character detector for receiving said start trigger signal and having a second input coupled to an output of said second special character detector for receiving said stop trigger signal; and
- a high-speed clock circuit coupled to a third input of said start/stop counter for providing high-speed clock pulses to said start/stop counter.

25. The data propagation delay measurement circuit as set forth in claim 24 wherein
- said start/stop counter starts counting high-speed clock pulses from said high-speed clock circuit when said start/stop counter receives said start trigger signal;
- said start/stop counter stops counting high-speed clock pulses from said high-speed clock circuit when said start/stop counter receives said stop trigger signal; and
- said start/stop counter outputs a counted number of high-speed clock pulses that represent said period of time that said special character spends within said transmit data path excluding said equalizer.

26. A method for measuring on-chip data propagation delay in a receive data path of a serializer/deserializer circuit, said method comprising the steps of:
- detecting a special character that is present at an output of an equalizer at an input of said receive data path;
- detecting said special character at an output of said receive data path; and
- obtaining a period of time that said special character spends within said receive data path excluding said equalizer.

27. The method as set forth in claim 26 wherein said step of detecting said special character that is present at said output of said equalizer of said receive data path comprises the steps of:
- coupling an input of a clock divider circuit to an output of a clock and data recovery unit of said receive data path;
- sampling said output of said equalizer of said receive data path in a first plurality of strobed comparators;
- clocking said first plurality of strobed comparators with a multi-phase, low speed clock produced by said clock divider circuit; and
- detecting said special character in said sampled input of said receive data path in a first special character detector coupled to an output of said first plurality of strobed comparators; and
- creating in said first special character detector a start trigger signal when said first special character detector detects said special character.

28. The method as set forth in claim 27 further comprising the step of:
- providing directly to a decoder unit of said receive data path said output of said first plurality of strobed comparators.

29. The method as set forth in claim 28 wherein said step of detecting said special character at said output of said receive data path comprises the steps of:
- sampling said output of said receive data path in a second plurality of strobed comparators;
- detecting said special character in said sampled output of said receive data path in a second special character detector coupled to an output of said second plurality of strobed comparators; and
- creating in said second special character detector a stop trigger signal when said second special character detector detects said special character.

30. The method as set forth in claim 29 wherein said step of obtaining said period of time that said special character spends within said receive data path excluding said equalizer comprises the steps of:
- receiving said start trigger signal in a start/stop counter that has a first input coupled to an output of said first special character detector;
- receiving said stop trigger signal in said start/stop counter that has a second input coupled to an output of said second special character detector; and
- receiving high-speed clock pulses in said start/stop counter from a high-speed clock circuit coupled to said start/stop counter.

31. The method as set forth in claim 30 further comprising the steps of:
- starting counting in said start/stop counter high-speed clock pulses when said start/stop counter receives said start trigger signal;
- stopping counting in said start/stop counter high-speed clock pulses when said start/stop counter receives said stop trigger signal; and
- outputting from said start/stop counter a counted number of high-speed clock pulses that represent said period of time that said special character spends within said transmit data path excluding said equalizer.

* * * * *